United States Patent [19]

Tabuchi et al.

[11] Patent Number: 5,240,753
[45] Date of Patent: Aug. 31, 1993

[54] MOLDED ARTICLES FOR HOLDING WAFERS

[75] Inventors: Akira Tabuchi; Morihiko Nakamura, both of Naruto, Japan

[73] Assignee: Otsuka Kagaku Kabushiki Kaisha, Osaka, Japan

[21] Appl. No.: 655,352

[22] PCT Filed: Jul. 4, 1990

[86] PCT No.: PCT/JP90/00863
§ 371 Date: Feb. 22, 1991
§ 102(e) Date: Feb. 22, 1991

[87] PCT Pub. No.: WO91/01044
PCT Pub. Date: Jan. 24, 1991

[30] Foreign Application Priority Data
Jul. 7, 1989 [JP] Japan .................. 1-176795

[51] Int. Cl.⁵ .................. B65D 85/42; H05F 3/02
[52] U.S. Cl. .................. 428/36.4; 428/1; 428/34.5; 428/902; 428/931; 206/328; 361/212
[58] Field of Search .......... 428/36.4, 1, 34.5, 902, 428/931; 206/328; 361/212; 252/188.28

[56] References Cited

U.S. PATENT DOCUMENTS

| | | | |
|---|---|---|---|
| 4,404,615 | 9/1983 | Dep | 206/328 |
| 4,722,441 | 2/1988 | Arai et al. | 206/328 |
| 4,815,596 | 3/1989 | Reid | 206/328 |
| 4,943,606 | 7/1990 | Inoue et al. | 524/500 |
| 4,983,713 | 1/1991 | Hayashi et al. | 524/601 |
| 5,039,525 | 8/1991 | Tamashima et al. | 524/423 |

FOREIGN PATENT DOCUMENTS

5959256 3/1984 Japan.
60-23446 2/1985 Japan.

*Primary Examiner*—George F. Lesmes
*Assistant Examiner*—Charles R. Nold
*Attorney, Agent, or Firm*—Armstrong, Westerman, Hattori, McLeland & Naughton

[57] ABSTRACT

The present invention provides a molded article for holding wafers which is made of a thermoplastic resin reinforced with whiskers. The present invention provides wafer holding molded articles, such as transport baskets, storage cases and carriers, for use in handling wafers and glass plates for liquid crystal televisions. These articles are useful for cleaning, drying, transporting or storing semiconductor wafers free of contamination.

14 Claims, 2 Drawing Sheets

MOLDED ARTICLES FOR HOLDING WAFERS

TECHNICAL FIELD

The present invention relates to molded articles for holding wafers. More particularly, the present invention relates to molded articles adapted for transporting, storing or stowing semiconductor wafers or glass plates for liquid crystal televisions free of contamination and with safety.

BACKGROUND ART

In semiconductor production processes, wafers are handled by the so-called cassette-to-cassette system wherein wafers are transported, as placed in wafer baskets or carriers, from step to step. This system has achieved remarkable increases in the quantity of semiconductors produced. The wafer production process is practiced entirely within a clean room or clean bench which is diminished in the amount of dust present to keep the surface of semiconductor wafers clean at all times.

Conventional wafer baskets are left open at opposite sides and at its upper portion for ease of cleaning, drying, transport or transfer, while wafers are generally left exposed when handled with carriers. Accordingly, wafers are very likely to be contaminated with small dust particles or the like remaining in the clean room. Wafer baskets are therefore transported or stored usually as accommodated in a closed box, whereas not infrequently, the wafer basket is transported as it is, or wafers are left exposed when transported with use of carriers, without considering the possibility of contamination. The influence of small dust particles is negligible when the width of patterns to be formed on semiconductor devices is small, but even dust particles as small as about 0.1 $\mu$m produce an adverse influence as the pattern width decreases with an increase in the complexity of integration as from LSI to VLSI. Thus, it has become increasingly important to prevent dust deposition on the wafer surface.

Conventional carriers, wafer baskets for cleaning, baskets for drying, baskets for transport and storage cases are predominantly synthetic resin moldings, and most of them are electrically chargeable insulating moldings which are prepared by molding polypropylene (PP) or like resin as it is (without reinforcement). Presently, therefore carriers, baskets and storage cases are damaged by wafers, producing dust, becoming charged to attract dust and permitting promoted deposition of dust on wafers to result in a high reject ratio. Further since the resin used is not reinforced, the baskets for cleaning or drying have the drawback of having insufficient thermal rigidity. On the other hand, in the case where carriers, baskets, storage cases and like wafer holding molded articles are reinforced with glass fiber, carbon fiber, chopped fiber or the like, it is impossible to internally reinforce the moldings up to the outermost surface thereof when observed microscopically. Consequently, it is always likely that the moldings will be damaged by wafers, or wafers themselves will be damaged by moldings which are as high as 6 to 7 in Moh's hardness.

On the other hand, the resin material is subjected to an antistatic treatment usually by adding carbon black thereto, whereas carbon black is extremely fine, very low in compatibility with the resin and prone to become released and scattered about to contaminate wafers owing to abrasion or frictional contact with wafers. Although investigations were conducted on surfactants for use as antistatic agents, they fail to retain a sustained antistatic effect and become a dust attractant like insulating moldings. Moreover, even the presence of a very small amount of vapor of surfactant could lead to the serious drawback of fogging up the wafer surface.

Further in the case of liquid crystal panels, rapid progress has been made in providing precision display screens with use of glass substrates of reduced thickness, which need to fulfill the same requirements as semiconductor wafers.

We have conducted intensive research to overcome the foregoing drawbacks of the prior art and consequently found that the contamination of wafers is attributable largely to incorporation of air in the cleaning step and to charging of air in the drying step. More specifically, when wafers as contained in a basket are dipped in a cleaning solution (acid, alkali or the like) for cleaning, many air bubbles adhere to the surface of the wafers, which in turn are contaminated with dust present in the bubbles. Since wafers are dried in air having a temperature of about 200° C., the air becomes charged when flowing rapidly, consequently charging the basket, which in turn attracts dust or the like to contaminate the wafer.

We have also found that the contamination of wafers can be remarkably prevented over the entire production process if it is possible to preclude wafer contamination in these cleaning and drying steps.

An object of the present invention is to provide a molded article for holding wafers which is capable of preventing deposition of dust and extraneous matter on the wafers during cleaning, drying, transport or storage, especially during cleaning and drying, and which is less likely to be damaged by the wafer and to cause damage to the wafer itself.

Another object of the invention is to provide a molded article for holding wafers which has improved thermal strength (inclusive of rigidity) as required of cleaning and drying baskets.

Another object of the invention is to provide a molded article for holding wafers which is also usable for cleaning, drying, transporting or storing glass plates for liquid crystal televisions.

Still another object of the invention is to provide the above-mentioned wafer holding articles at a low cost without necessitating special handling.

The foregoing objects of the present invention, especially prevention of contamination of wafers in the cleaning and drying steps, can be accomplished by using a molded article (basket or the like) made of a thermoplastic resin containing whiskers.

Disclosure of the Invention

Thus, the present invention provides wafer holding molded articles made of a thermoplastic resin reinforced with whiskers.

Examples of whiskers for use in the present invention are aluminum borate whiskers, silicon carbide whiskers, silicon nitride whiskers, zinc oxide whiskers, basic magnesium sulfate whiskers, magnesium oxide whiskers, graphite whiskers, potassium titanate whiskers, magnesium borate whiskers, titanium diboride whiskers, calcium sulfate whiskers, electrically conductive potassium titanate whiskers and the like. In view of the properties, configuration, hardness, cost, etc. of whiskers, preferable among these examples are potassium titanate whiskers, conductive potassium titanate whiskers, zinc oxide whiskers and graphite whiskers.

Potassium titanate whiskers are represented by:

$$K_2O \cdot mTiO_2$$

wherein m is a real number of up to 8. Especially desirable among such whiskers are those which are 0.01 to 1 μm in average filament diameter, 1 to 100 μm in average filament length and at least 10 in average filament length/average filament diameter ratio (aspect ratio).

Electrically conductive potassium titanate whiskers are represented by:

$$K_2O \cdot n(TiO_2-x)$$

wherein n is a real number of up to 8, and x is a real number smaller than 2. Especially preferable among such whiskers are those which are 0.01 to 1 μm in average filament diameter, 1 to 100 μm in average filament length and at least 10 in aspect ratio.

Also usable are other electrically conductive potassium titanate whiskers such as those prepared by adhering or depositing a conductive or semi-conductive substance, such as a metal or metal oxide, on the surface of potassium titanate whiskers, for example by the electroless plating process, dipping process or precoating process.

The thermoplastic resin to be used in the present invention is preferably one having high resistance to heat and chemicals since the product, i.e., the wafer holding molded article, is subjected to a chemical cleaning step for removing therefrom contaminants, i.e., particles, organic materials, metals and natural oxide films. Examples of such resins are polystyrene, ABS resin, polyphenylene oxide, ionomer resin, polyethylene, polypropylene, nylon 6 resin, nylon 6,6 resin, aromatic polyamide resin, polycarbonate, polyacetal, polyphenylene sulfide, trimethylpentene resin, polyether ether ketone (PEEK), polyether ketone (PEK), polysulfone (PSF), tetrafluoroethylene/perfluoroalkoxyethylene copolymer (PFA), polyethersulfone (PES), high-temperature amorphous resin (HTA), polyallylsulfone (PASF), polyetherimide (PEI), liquid crystal polymer (LCP), polyvinylidene fluoride (PVDF), ethylene/tetrafluoroethylene copolymer (ETFE), tetrafluoroethylene/hexafluoropropylene copolymer (FEP), tetrafluoroethylene/hexafluoropropylene/perfluoroalkoxyethylene terpolymer (EPE), etc. Especially preferable among there are PEK, PEEK, PES, PEI, PSF, PASF, PFA, FEP, HTA, LCP and the like.

When the thermoplastic resin to be used in the present invention is polypropylene (PP) which is prepared usually by polymerizing propylene in the presence of a Ziegler-Natta catalyst, it is desirable to add to the resin a hydrochloric acid absorbing agent for absorbing the catalyst and an antioxidant (or peroxide decomposing agent) for preventing oxidation to which PP is susceptible. Preferably, the antioxidant (or peroxide decomposing agent) is used in an amount of 10 to 1000 ppm, and the hydrochloric acid absorbing agent in an amount of 200 to 500 ppm. If the amounts of these agents are outside the respective ranges, the wafer holding molded article is likely to exhibit impaired perperties.

Examples of useful antioxidants (or peroxide decomposing agents) are phenolic compounds such as 2,6-di-tert-butyl-p-cresol, butylated hydroxyanisole (BHA), 2,6-di-tert-butyl-4-ethylphenol, stearyl- β-(3,5-di-tert-butyl-4hydroxypheny))propionate, 2,2'-methylenebis(4-methyl-6-tert-butylphenol), 2,2'-methylenebis(4-ethyl-6-tert-butylphenol), 4,4'-thiobis(3-methyl-6-tert-butylphenol), 4,4'-butylidenebis-(3-methyl-6-tert-butylphenol), 1,1,3-tris(2-methyl-4-hydroxy-5-tert-butylphenol)butane, 1,3,5-trimethyl-2,4,6-tris(3,5-di-tert-butyl-4-hydroxybenzyl)benzene, tetrakis[methylene-3(3',5'-di-tert-butyl-4'-hydroxyphenyl)propionate]methane and bis[3,3'-bis(4'-hydroxy-3'-tert-butylphenyl)-butyric acid]glycol ester, sulfur compounds such as dilaurylthio dipropionate, dimyristylthio dipropionate and distearylthio dipropionate, and phosphorus compounds such as triphenyl phosphite, diphenylisodecyl phosphite, phenyldiisodecyl phosphite, 4,4'-butylidenebis(3-methyl-6-tert-butylphenyl-di-tridecyl)-phosphite, cyclic neopentanetetraylbis(octadecylphosphite), tris(nonylphenyl)phosphite, tris(mono- and-/or di-nonylphenyl)phosphite, diisodecylpentaerythritol diphosphite and 9,10-dihydro-9-oxa-10-phosphaphenanthrene-10-oxide, etc.

Examples of useful hydrochloric acid absorbing agents are calcium stearate, zinc stearate and like metal salts of fatty acids, epoxidized soybean oil, hydrotalcite and the like. These antioxidants (or peroxide decomposing agents) and hydrochloric acid absorbing agents can be used singly or in combination.

According to the present invention, whiskers are used usually in an amount of 5 to 50 wt. %, preferably 10 to 40 wt. %, based on the thermoplastic resin.

When conductive potassium titanate whiskers are used among other whiskers according to the invention, these whiskers, which are in the form of microscopic filaments, can be uniformly dispersed throughout the entire body of the wafer basket or storage case, whereby the microscopic portions thereof can be controlled to more uniform electric conductivity and given more uniform mechanical properties.

The wafer holding molded articles of the present invention, such as wafer baskets for transport, storage cases and carriers, can be produced usually by a known method with the exception of using the above materials, for example, by pelletizing the resin composition using a twin screw extruder and subjecting the pelletized composition to injection molding.

Molded articles of the present invention can be advantageously usable, for example, as baskets for electronic parts which must be free from dust, electronic parts which require a line wiring structure, etc. Examples of such electronic parts are LCDs, DCDs, ECDs, ELs, PCDs, ICs, LSIs and the like. Such articles are favorably usable also for the production and storage of glass plates for liquid crystal televisions.

1-wafer support, 2-wafer support groove, 3-fixing portion, 4-side plate, 5-groove, 6-upper plate, 7, 11-wafer, 8-wafer carrier, 9-basket, 10-storage case.

Best Mode of Carrying Out the Invention

The invention will be described with reference to the following examples.

EXAMPLES 1 TO 13 AND COMPARATIVE EXAMPLES 1 TO 5

Figure 1:
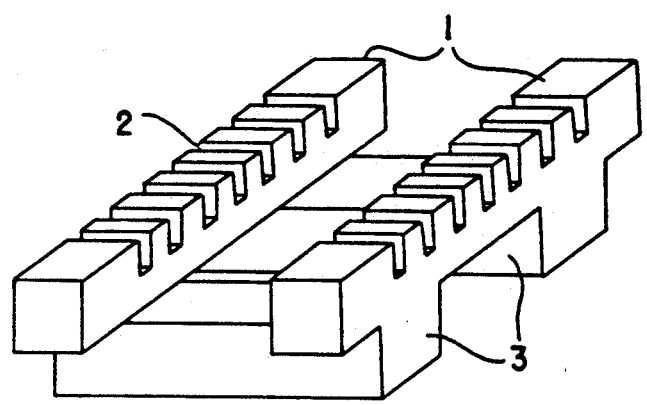
FIGS. 1 and 2 are perspective views of carriers.
Figure 2:
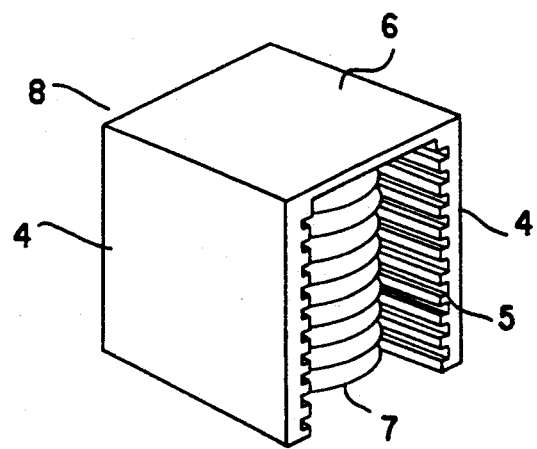
Figure 3:
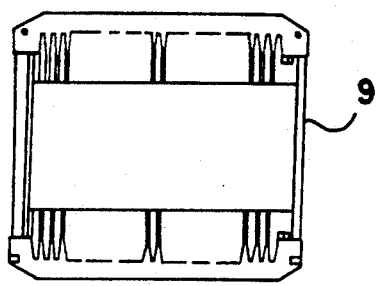
FIG. 3 is a plan view of a wafer basket for transport.
Figure 4:
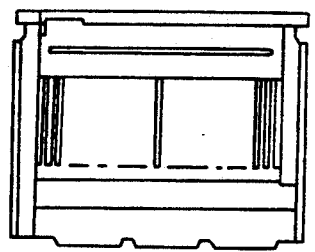
FIG. 4 is a side elevation of the same.
Figure 5:
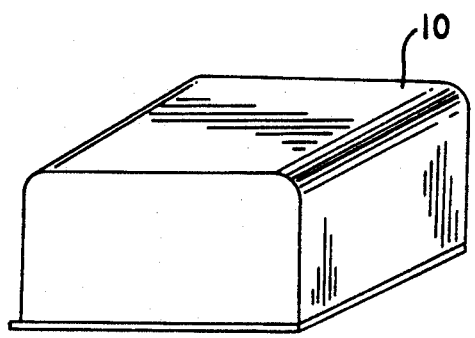
FIG. 5 shows a storage case.
Figure 6:
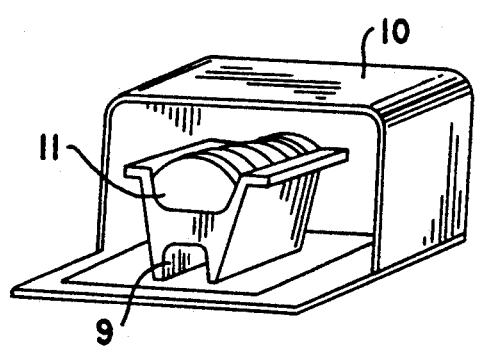
FIG. 6 schematically shows a wafer basket for transport as accommodated in the storage case.

Each of the compositions listed in Table 1 was pelletized by a twin screw extruder-kneader. Using an injection molding machine, the pelletized composition was molded into carriers shown in FIGS. 1 and 2, transport baskets shown in FIGS. 3 and 4, and storage cases shown in FIG. 5. FIG. 6 is a diagram showing the transport basket as accommodated in the storage case.

The molded articles were used for 3 months in a wafer production process to check wafers for contamination by observing the state of the molded articles and the influence thereof on the wafers. In the table, "A" indicates that flaws were found on the molded article due to the insertion or removal of wafers, and "B" represents adhesion of many dust particles to wafers.

TABLE 1

| | Example | | | | | | | | |
|---|---|---|---|---|---|---|---|---|---|
| | 1 | 2 | 3 | 4 | 5 | 6 | 7 | 8 | 9 |
| polystyrene | 70 | | | | | | | | |
| ABS resin | | 70 | | | | | | | |
| polyphenylene oxide | | | 70 | | | | | | |
| ionomer resin | | | | 70 | | | | | |
| polyethylene | | | | | 70 | | | | |
| polypropylene | | | | | | 70 | | | |
| nylon 6 resin | | | | | | | 70 | | |
| nylon 6,6 resin | | | | | | | | 70 | |
| aromatic polyamide resin | | | | | | | | | 70 |
| polycarbonate | | | | | | | | | |
| polyacetal | | | | | | | | | |
| polyphenylene sulfide | | | | | | | | | |
| trimethylpentene resin | | | | | | | | | |
| potassium titanate whisker | 30 | 30 | 30 | 30 | 30 | 30 | 30 | 30 | 30 |
| glass fiber | | | | | | | | | |
| mica | | | | | | | | | |
| carbon black | | | | | | | | | |
| state of molded article | good | good | good | good | good | good | good | good | good |
| influence on wafer | none | none | none | none | none | none | none | none | none |

| | Example | | | | Comparative Example | | | | |
|---|---|---|---|---|---|---|---|---|---|
| | 10 | 11 | 12 | 13 | 1 | 2 | 3 | 4 | 5 |
| polystyrene | | | | | | | | | |
| ABS resin | | | | | | | | 100 | |
| polyphenylene oxide | | | | | | | | | |
| ionomer resin | | | | | | | | | |
| polyethylene | | | | | | | | | |
| polypropylene | | | | | 70 | 70 | 80 | | |
| nylon 6 resin | | | | | | | | | |
| nylon 6,6 resin | | | | | | | | | |
| aromatic polyamide resin | | | | | | | | | |
| polycarbonate | 70 | | | | | | | | |
| polyacetal | | 70 | | | | | | | 100 |
| polyphenylene sulfide | | | 70 | | | | | | |
| trimethylpentene resin | | | | 70 | | | | | |
| potassium titanate whisker | 30 | 30 | 30 | 30 | | | | | |
| glass fiber | | | | | 30 | | | | |
| mica | | | | | | 30 | | | |
| carbon black | | | | | | | 20 | | |
| state of molded article | good | good | good | good | good | A | A | A | A |
| influence on wafer | none | none | none | none | B | B | B | B | B |

TABLE 2

| | Example | | | | | Com. Ex. |
|---|---|---|---|---|---|---|
| | 14 | 15 | 16 | 17 | 18 | 6 |
| polyether ether ketone (PEEK) | 70 | 70 | 70 | 70 | 70 | 70 |
| silicon nitride whisker | 30 | | | | | |
| aluminum borate whisker | | 30 | | | | |
| basic magnesium sulfate whisker | | | 30 | | | |
| magnesium oxide whisker | | | | 30 | | |
| potassium titanate whisker | | | | | 30 | |
| glass fiber | | | | | | 30 |
| state of molded articles | good | good | good | good | good | good |
| influence on wafer | C | C | C | C | none | B |

EXAMPLES 14 TO 18 AND COMPARATIVE EXAMPLE 6

Wafer holding molded articles were prepared in the same manner as in Example 1 with the exception of using the compositions listed in Table 2. "C" in the table indicates that a very small amount of dust adhered to wafers.

EXAMPLES 19 TO 26

Wafer holding molded articles were prepared in the same manner as in Example 1 with the exception of using the compositions listed in Table 3. "Dentall WK200" is electrically conductive potassium titanate whiskers (product of Otsuka Kagaku K.K.). The surface resistance was measured by the method of JIS K6911.

TABLE 3

| | Example | | | | | | | |
|---|---|---|---|---|---|---|---|---|
| | 19 | 20 | 21 | 22 | 23 | 24 | 25 | 26 |
| PES | 65 | | | | | | | |
| PEEK | | 65 | | | | | | |
| PEK | | | 65 | | | | | |
| PSF | | | | 65 | | | | |
| PEI | | | | | 65 | | | |
| PASF | | | | | | 65 | | |
| HTA | | | | | | | 65 | |
| PFA | | | | | | | | 65 |
| Dentall WK200 | 35 | 35 | 35 | 35 | 35 | 35 | 35 | 35 |
| surface resistance ($\Omega$) | $10^5$ | $10^5$ | $10^5$ | $10^5$ | $10^5$ | $10^5$ | $10^5$ | $10^6$ |
| state of molding article | good | good | good | good | good | good | good | good |
| influence on wafer | none | none | none | none | none | none | none | none |

PES: Victrex PES 4100G (ICI)
PEEK: Victrex PEEK 450G (ICI)
PEK: Victrex PEK 220G (ICI)
PSF: Udel Polysulfone P1700 (AMOCO)
PEI: Polyetherimide Ultem 1000 (GE)
PASF: Polyallylsulfone Radel A400 (UCC)
HTA: High Temperature. Engineering Thermoplastic HTA 7600G (ICI)
PFA: Fluorinated alkoxyetheylene resin (Mitsui Fluorochemicals Co., Ltd.)

EXAMPLE 27 AND COMPARATIVE EXAMPLES 7 AND 8

Wafer holding molded articles were prepared in the same manner as in Example 1 with the exception of using the compositions listed in Table 4. "Dentol BK200" is electrically conductive potassium titanate whiskers (product of Otsuka Kagaku K.K.).

Wafers as placed in the basket were allowed to stand in a clean room for 3 months and checked for the fogging of the wafers with the unaided eye to determine the contamination of the wafers. The surface resistance was measured by the same method as above according to JIS K6911. The retentivity of the antistatic property was determined by repeating five times the step of immersing the molded article in a water bath for 30 minutes and thereafter allowing the article to stand at room temperature for 3 hours, and then measuring the surface resistance as a standard of durability.

TABLE 4

| | Example | Comparative Example | |
|---|---|---|---|
| | 27 | 7 | 8 |
| polypropylene(1) | 70 | | |
| polypropylene(2) | | 70 | |
| polypropylene(3) | | | 70 |
| Dentall BK200 | 30 | 30 | 30 |
| contamination of wafer | no fogging | slightly fogging | fogging on whole surface |
| retentivity of antistatic property | excellent | excellent | excellent |
| surface resistance ($\Omega$) | $10^5$ | $10^5$ | $10^5$ |

Notes to Table 4

Polypropylene (1) contains 300 ppm of tetrakis-[methylene-3-(3',5'-di-tert-butyl-4'-hydroxyphenyl)-propionate]methane and 500 ppm of tris(dinonylphenyl)-phosphite as antioxidants or peroxide decomposing agents, and 400 ppm of calcium stearate as a hydrochloric acid absorbing agent.

Polypropylene (2) contains 1000 ppm of tetrakis-[methylene-3-(3',5'-di-tert-butyl-4'-hydroxyphenyl)-propionate]methane and 1000 ppm of tris(dinonylphenyl)-phosphite as antioxidants or peroxide decomposing agents, and 1000 ppm of calcium stearate as a hydrochloric acid absorbing agent.

Polypropylene (3) contains 500 ppm of tetrakis-[methylene-3-(3',5'-di-tert-butyl-4'-hydroxyphenyl)-propionate]methane, 600 ppm of 2,6-di-tert-butyl-p-cresol and 900 ppm of dimyristylthio dipropionate as antioxidants or peroxide decomposing agents, and 1000 ppm of calcium stearate as a hydrochloric acid absorbing agent.

EXAMPLES 28 TO 33 AND COMPARATIVE EXAMPLE 9

The composition listed in Table 5 were molded by the same process as in Example 1 using the same wafer basket and storage case molds and checked for surface resistance and adhesion of dust.

TABLE 5

| | Example | | | | | | Com. Ex. |
|---|---|---|---|---|---|---|---|
| | 28 | 29 | 30 | 31 | 32 | 33 | 9 |
| polypropylene (1) | 90 | 80 | 70 | 60 | 80 | 70 | 100 |
| Dentall BK200 | 10 | 20 | 30 | 40 | | | — |
| Dentall WK200 | | | | | 20 | 30 | — |
| surface resistance ($\Omega$) | $10^{12}$ | $10^9$ | $10^5$ | $10^3$ | $10^{10}$ | $10^7$ | $10^{15}$ |

Industrial Applicability

The present invention provides wafer holding molded articles, such as transport baskets, storage cases and carriers, for use in handling wafers and glass plates for liquid crystal televisions. These articles are useful for cleaning, drying, transporting or storing semiconductor wafers free of contamination.

We claim:

1. A molded article for holding wafers, comprising a thermoplastic resin reinforced with whiskers, the molded article being provided with means for holding a wafer; wherein
    said thermoplastic resin is at least one resin selected from the group consisting of polyether ketone, polyether ether ketone, polyether sulfone, polyetherimide, polysulfone, polyallylsulfone, tetrafluoroethylene/perfluoroalkoxyethylene copolymer, tetrafluoroethylene/hexafluoropropylene copolymer, and liquid crystal polymer; and
    said whiskers are at least one member selected from the group consisting of aluminum borate whiskers, silicon carbide whiskers, silicon nitride whiskers, zinc oxide whiskers, basic magnesium sulfate whiskers, magnesium oxide whiskers, graphite whiskers, potassium titanate whiskers, magnesium borate whiskers, titanium diboride whiskers, calcium sulfate whiskers, and electrically conductive potassium titanate whiskers.

2. A molded article for holding wafers as defined in claim 1 wherein the whiskers are potassium titanate filaments.

3. A molded article for holding wafers as defined in claim 1 wherein the whiskers are electrically conductive potassium titanate filaments.

4. A molded article for holding wafers as defined in claim 1 which is one of a wafer basket, storage case and carrier.

5. A molded article for holding wafers as defined in claim 1 for use in one of cleaning, drying, transporting and storing semiconductor wafers.

6. A molded article for holding wafers as defined in claim 1 for use in cleaning, drying, transporting or storing glass plates for liquid crystal televisions.

7. A method of handling semiconductor wafers while minimizing contamination, comprising placing said wafers in a molded article, the molded article comprising a thermoplastic resin reinforced with potassium titanate filaments, said filaments being present in an amount sufficient to prevent charging of said molded article.

8. The method of claim 7, further comprising the steps of dipping said molded article containing said wafers in a cleaning solution and then drying said wafers.

9. The method of claim 7, wherein said potassium titanate filaments are electrically conductive.

10. The method of claim 7, wherein the thermoplastic resin is at least one resin selected from the group consisting of polyether ketone, polyether ether ketone, polyether sulfone, polyetherimide, polysulfone, polyallylsulfone, tetrafluoroethylene/perfluoroalkoxyethylene copolymer, tetrafluoroethylene/hexafluoropropylene copolymer, and liquid crystal polymer.

11. The method of claim 7, wherein the thermoplastic resin is polypropylene, and the polypropylene has admixed therewith 10 to 1000 ppm of an antioxidant and 200 to 500 ppm of a hydrochloric acid absorbing agent.

12. The method of claim 7, wherein said molded article is one of a wafer basket, storage case and carrier.

13. A method of handling semiconductor wafers while minimizing contamination with dust particles, comprising placing said wafers in a thermoplastic resin molded article, and minimizing dust contamination of the wafers while in the molded article by reinforcing the molded article with potassium titanate filaments in an amount sufficient to minimize adhesion of dust particles to said wafers by retaining an antistatic property and in an amount sufficient to maintain the molded article substantially without flaws resulting from insertion and removal of said wafers therefrom.

14. A molded article for holding wafers, comprising a thermoplastic resin reinforced with whiskers the molded article being provided with means for holding a wafer, wherein the thermoplastic resin is polypropylene, and the polypropylene has admixed therewith 10 to 1000 ppm of one of an antioxidant and a peroxide decomposing agent, and 200 to 500 ppm of a hydrochloric acid absorbing agent; and said whiskers are at least one member selected from the group consisting of aluminum borate whiskers, silicon carbide whiskers, silicon nitride whiskers, zinc oxide whiskers, basic magnesium sulfate whiskers, magnesium oxide whiskers, graphite whiskers, potassium titanate whiskers, magnesium borate whiskers, titanium diboride whiskers, calcium sulfate whiskers, and electrically conductive potassium titanate whiskers.

* * * * *